US012763774B2

(12) United States Patent
McCollum et al.

(10) Patent No.: US 12,763,774 B2
(45) Date of Patent: Oct. 13, 2026

(54) APPARATUS INCLUDING A CMOS PASS GATE CIRCUIT AND A BOOTSTRAP CIRCUIT

(71) Applicant: Microsemi SoC Corp., Chandler, AZ (US)

(72) Inventors: John Lynn McCollum, Orem, UT (US); Fethi Dhaoui, Mountain House, CA (US)

(73) Assignee: Microsemi SoC Corp., Chandler, AZ (US)

( * ) Notice: Subject to any disclaimer, the term of this patent is extended or adjusted under 35 U.S.C. 154(b) by 143 days.

(21) Appl. No.: 18/760,689

(22) Filed: Jul. 1, 2024

(65) Prior Publication Data

US 2025/0309898 A1 Oct. 2, 2025

Related U.S. Application Data

(60) Provisional application No. 63/572,620, filed on Apr. 1, 2024.

(51) Int. Cl.

| | |
|---|---|
| ***H03K 19/0185*** | (2006.01) |
| ***H03K 3/012*** | (2006.01) |
| ***H03K 17/06*** | (2006.01) |
| ***H03K 19/017*** | (2006.01) |

(52) U.S. Cl.

CPC ..... *H03K 19/018521* (2013.01); *H03K 3/012* (2013.01); *H03K 17/063* (2013.01); *H03K 19/01714* (2013.01)

(58) Field of Classification Search

CPC ................. H03K 19/01; H03K 19/017; H03K 19/01714; H03K 19/0175; H03K 19/0185; H03K 19/018507; H03K 19/018521; H03K 17/06; H03K 17/063

See application file for complete search history.

(56) References Cited

U.S. PATENT DOCUMENTS

| | | | | |
|---|---|---|---|---|
| 4,484,092 A | 11/1984 | Campbell, Jr. | | |
| 5,949,271 A | 9/1999 | Fujikura | | |
| 6,185,119 B1 | 2/2001 | Haeberli et al. | | |
| 6,380,792 B1 * | 4/2002 | Yamamoto | H03K 17/063 | 327/390 |
| 6,404,237 B1 * | 6/2002 | Mathew | H03K 17/063 | 326/88 |
| 7,064,599 B1 * | 6/2006 | Taft | H03K 17/063 | 327/390 |
| 7,471,135 B2 | 12/2008 | Raghavan et al. | | |

(Continued)

OTHER PUBLICATIONS

International Search Report and Written Opinion for PCT Application No. PCT/US2024/036,522 (Dated Jul. 2, 2024).

*Primary Examiner* — Jason M Crawford
(74) *Attorney, Agent, or Firm* — Hovey Williams LLP

(57) ABSTRACT

One or more examples relate to a complementary metal-oxide-semiconductor (CMOS) device. The CMOS device includes a CMOS pass gate circuit, a control circuit, and a bootstrap circuit. The CMOS pass gate circuit includes an n-channel transistor and a p-channel transistor. The control circuit may activate and deactivate the CMOS pass gate circuit. The bootstrap circuit may be electrically connected between the CMOS pass gate circuit and the control circuit. The bootstrap circuit may increase a first drive gain of the n-channel transistor and a second drive gain of the p-channel transistor.

20 Claims, 4 Drawing Sheets

(56) References Cited

U.S. PATENT DOCUMENTS

| | | | | |
|---|---|---|---|---|
| 8,143,934 | B1 * | 3/2012 | Shutt | H03K 17/063 327/437 |
| 8,354,873 | B2 * | 1/2013 | Ono | H03K 17/164 327/437 |
| 8,847,665 | B2 * | 9/2014 | Araki | H03K 17/08122 327/427 |
| 9,621,156 | B2 * | 4/2017 | Aherne | H03K 17/6872 |
| 2002/0084803 | A1 * | 7/2002 | Mathew | H03K 17/063 326/113 |
| 2004/0070441 | A1 * | 4/2004 | Bringivijayaraghavan | H03K 17/063 327/534 |
| 2011/0193615 | A1 * | 8/2011 | Ono | H03K 17/164 327/437 |
| 2012/0013391 | A1 * | 1/2012 | Krauss | H03K 17/063 327/437 |
| 2015/0318853 | A1 * | 11/2015 | McCollum | H03K 17/6872 327/437 |
| 2022/0311439 | A1 * | 9/2022 | Gupta | H03K 17/693 |
| 2025/0309898 | A1 * | 10/2025 | McCollum | H03K 5/12 |

* cited by examiner

APPARATUS INCLUDING A CMOS PASS GATE CIRCUIT AND A BOOTSTRAP CIRCUIT

CROSS-REFERENCE TO RELATED APPLICATIONS

The current patent application claims the benefit under 35 U.S.C. § 119(e) of the priority date of U.S. Provisional Application Ser. No. 63/572,620; titled "LOW POWER HIGH PERFORMANCE FPGA CMOS SWITCH WITH BOOT STRAP"; and filed Apr. 1, 2024. The Provisional application is hereby incorporated by reference, in its entirety, into the current patent application.

TECHNICAL FIELD

Various examples of the present disclosure relate to a complementary metal-oxide-semiconductor (CMOS) device having a bootstrap circuit.

BACKGROUND

Complementary metal-oxide-semiconductor (CMOS) pass gate circuits are commonly implemented field-programmable gate array (FPGA) devices. However, existing CMOS pass gate circuits have significant current leakage or voltage decay, and consume significant static power and dissipated heat.

This background discussion is intended to provide information related to the present invention which is not necessarily prior art.

SUMMARY OF THE INVENTION

This brief description is provided to introduce a selection of concepts in a simplified form that are further described in the detailed description below. This brief description is not intended to identify key features or essential features of the claimed subject matter, nor is it intended to be used to limit the scope of the claimed subject matter. Other aspects and advantages of the present disclosure will be apparent from the following detailed description of the examples and the accompanying figures.

According to various examples of the present disclosure, an apparatus is provided that includes a complementary metal-oxide-semiconductor (CMOS) pass gate circuit, a control circuit, and a bootstrap circuit. The CMOS pass gate circuit may include a first n-channel transistor and a first p-channel transistor. The control circuit may generate control signals to activate the CMOS pass gate circuit. The bootstrap circuit may be electrically connected between the CMOS pass gate circuit and the control gate circuit. The bootstrap circuit may increase a first drive gain of the first n-channel transistor and a second drive gain of the first p-channel transistor.

According to various examples of the present disclosure, a circuit arrangement is provided. The circuit arrangement may include a complementary metal-oxide-semiconductor (CMOS) pass gate circuit and a bootstrap circuit. The bootstrap circuit may be electrically connected to the CMOS pass gate circuit. The bootstrap circuit may increase a drive gain of the CMOS pass gate circuit.

According to various examples of the present disclosure, a method is provided. One or more power supplies may activate a bootstrap circuit. A control circuit may generate one or more control signals. A complementary metal-oxide-semiconductor (CMOS) pass gate circuit may be activated by the bootstrap circuit based on the one or more control signals. The CMOS pass gate circuit may receive an input signal. The bootstrap circuit may increase a drive gain of the CMOS pass gate circuit.

Figure 1:
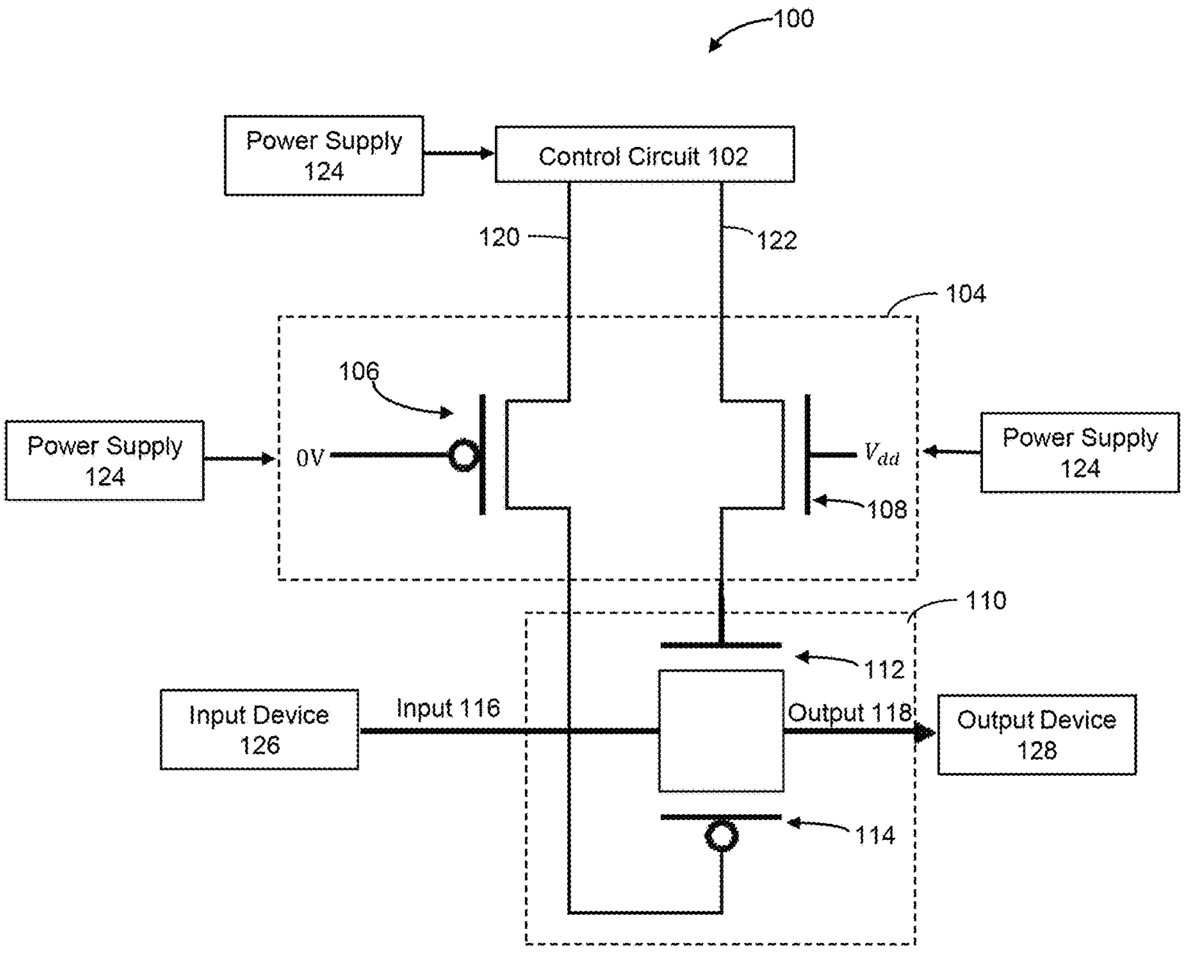
FIG. 1 illustrates an example complementary metal-oxide-semiconductor (CMOS) device having a bootstrap circuit and a first control circuit configuration.

Unless otherwise indicated, the figures provided herein are meant to illustrate features of examples of this disclosure. These features are believed to be applicable in a wide variety of systems comprising one or more examples of this disclosure. As such, the figures are not meant to include all conventional features known by those of ordinary skill in the art to be required for the practice of the examples disclosed herein.

DETAILED DESCRIPTION

In the following detailed description, reference is made to the accompanying drawings, which form a part hereof and in which are shown, by way of illustration, specific examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, operations, features, functions, or the like.

It will be readily understood that the components of the examples as generally described herein and illustrated in the drawings could be arranged and designed in a wide variety of different configurations. Thus, the following description of various examples is not intended to limit the scope of the present disclosure but is merely representative of various examples.

Various examples of the present disclosure relate to a CMOS device having a bootstrap circuit and a CMOS pass gate circuit. The bootstrap circuit may boost a drive gain of the CMOS pass gate circuit. The boosted drive gain may enable a constant drive voltage to be maintained across one or more transistors included in the CMOS pass gate circuit. Maintaining a constant drive voltage may prevent significant current leakage or voltage decay associated with the CMOS pass gate circuit during operation of the CMOS device.

In various examples, the CMOS device may be utilized as part of a reprogrammable device or an integrated circuit (IC), without limitation. In various examples, the reprogrammable device may be a field-programmable gate array (FPGA), a programmable logic device (PLD), or a field-programmable system level integrated circuit (FPSLIC), without limitation. The reprogrammable device may include a control circuit. The control circuit may be a configuration memory circuit. The configuration memory circuit may include a random access memory (RAM), static random access memory (SRAM), a serial SRAM, a non-volatile random access memory (NVRAM), a serial peripheral interface (SPI) flash memory, a non-volatile static random access memory (NVSRAM), or a non-volatile memory (NVM) type circuit, without limitation. In various examples, a plurality of CMOS devices may be implemented in the reprogrammable device.

FIG. 1 illustrates a complementary metal-oxide-semiconductor (CMOS) device 100 including a control circuit 102, a bootstrap circuit 104, a CMOS pass gate circuit 110, an input terminal 116, an output terminal 118, and one or more power supplies 124. The CMOS device 100 may receive an input signal from an input device 126 and provide an output signal to an output device 128. The output signal may include data to be provided to the output device 128. In various examples, the input device may be a reprogrammable device. In various examples, the reprogrammable device may be an FPGA, FPSLIC, PLD, one or more multiplexors, or another type of reprogrammable device, without limitation. In various examples, the input device 126 and the output device 128 may be additional CMOS devices 100. In various examples, the input device 128 may be a memory device or a reprogrammable device, without limitation. In various examples, the output device 128 may be a memory device or a reprogrammable device. In various examples, the memory device may be as a RAM, SRAM, serial SRAM, NVRAM, SPI flash memory, or NVSRAM, or other NVM type circuit, without limitation. In various examples, the CMOS device 100, the input device 126, and the output device 128 may be integrated into one or more reprogrammable devices. In various examples, the output device 128 may correspond to an arithmetic function or other logic function to be performed by one or more reprogrammable devices.

In various examples, the control circuit 102 may be a memory device for configuring one or more FPGAs, such as a RAM, SRAM, serial SRAM, NVRAM, SPI flash memory, NVSRAM, or other NVM type circuit, without limitation. The control circuit 102 may configure or reprogram one or more reprogrammable devices, such as an FPGA, FPSLIC, or PLD, without limitation. The control circuit 102 may be electrically connected to one or more power supplies 124. The one or more power supplies 124 may provide electric power to the control circuit 102. In various examples, the one or more power supplies 124 connected to the control circuit 102 may or may not be the same as the one or more power supplies 124 electrically connected to the bootstrap circuit 104. In various examples, the one or more power supplies 124 may be a voltage rail or voltage bus, without limitation.

In various examples, the CMOS pass gate circuit 110 includes a first n-channel transistor 112 and a first p-channel transistor 114. In various examples, the first n-channel transistor 112 may be an n-channel metal oxide semiconductor (NMOS) transistor and the first p-channel transistor 114 may be a p-channel metal oxide semiconductor (PMOS) transistor. In various examples, the bootstrap circuit 104 includes a second p-channel transistor 106 and a second n-channel transistor 108. In various examples, the second p-channel transistor 106 may be a PMOS transistor and the second n-channel transistor 108 may be an NMOS transistor.

The PMOS transistor 106 includes a gate terminal, a source terminal, and a drain terminal. The gate terminal of the PMOS transistor 106 may be electrically connected to the one or more power supplies 124, as described above. The drain terminal of the PMOS transistor 106 may be electrically connected to the control circuit 102. The NMOS transistor 108 includes a gate terminal, a source terminal, and a drain terminal. The gate terminal of the NMOS transistor 108 may be electrically connected to the one or more power supplies 124, as described above. The drain terminal of the NMOS transistor 108 may be electrically connected to the control circuit 102. The gate, source, and drain terminals of the NMOS transistor 108 and PMOS transistor 106 are described in detail below with reference to FIG. 4. In various examples, the one or more power supplies may activate the bootstrap circuit 104 by supplying 0V the gate terminal of the PMOS transistor 106 and the source voltage $V_{dd}$ to the gate terminal of the NMOS transistor 108.

In various examples the NMOS transistor 112 includes a gate terminal, a source terminal, and a drain terminal. The PMOS transistor 114 includes a gate terminal, a source terminal, and a drain terminal. The source terminal of the PMOS transistor 114 and the source terminal of the NMOS transistor 112 may be electrically connected to the input terminal 116. The drain terminal of the PMOS transistor 114 and the drain terminal of the NMOS transistor 112 may be electrically connected to the output terminal 118. The gate, source, and drain terminals of the NMOS transistor 112 and PMOS transistor 114 are described in detail below with reference to FIG. 3.

The control circuit 102 may include a first output terminal 120 and a second output terminal 122. The control circuit 102 may generate one or more control signals for activating or deactivating the CMOS pass gate circuit 110. The one or more control signals may include a logic high value, a logic low value, or both a logic high value and a logic low value, without limitation. The one or more control signals may include a first complementary control signal and a second complementary control signal. The first complementary control signal may activate or deactivate the NMOS transistor 112 and may be provided on the control circuit second output terminal 122. The second complementary control signal may activate or deactivate the PMOS transistor 114 and may be provided on the control circuit first output terminal 120. The first and second output terminals 120, 122 may convey the complementary control signals to the bootstrap circuit 104. The bootstrap circuit 104 may pass the complementary control signals to the CMOS pass gate circuit 110.

In various examples, the first and second complementary control signals may have complementary values. In a first state, the first complementary control signal may include the logic low value and the second complementary control signal may include the logic high value. The first state of the control signals may activate the CMOS pass gate circuit 110. In a second state, the first complementary control signal may include the logic high value and the second complementary control signal may include the logic low value. The second state of the control signal may deactivate the CMOS pass gate circuit 110. In various examples, the logic high value may be equivalent to a source voltage $V_{dd}$. The logic low value may be equivalent to a ground voltage. In various examples, the source voltage $V_{dd}$ may be 0.75V, 0.85V, 1.5V, or another voltage, without limitation. The ground voltage may be 0V, without limitation.

In various examples, PMOS transistor 106 and NMOS transistor 108 may be electrically connected to one or more power supplies 124. The one or more power supplies 124 may activate the bootstrap circuit 104. The one or more power supplies 124 may supply the source voltage $V_{dd}$ to the gate terminal of the NMOS transistor 108 and the ground voltage to the gate terminal of the PMOS transistor 106.

In various examples, the gate terminal of the NMOS transistor 112 may be electrically connected to the source terminal of the NMOS transistor 108. A first drive voltage corresponding to the first complementary control signal may be received at the gate terminal of the NMOS transistor 112. More specifically, the first drive voltage may be generated by the NMOS transistor 112 in response to receiving the first complementary control signal. The NMOS transistor 108 of the bootstrap circuit 104 may receive the first complementary control signal and provide the first drive voltage to the NMOS transistor 112. The bootstrap circuit 104 may increase a first drive gain of the NMOS transistor 108 based on, at least in part, the value of the first complementary control signal. The first complementary control signal may activate or deactivate the NMOS transistor 112. The first complementary control signal having the high logic value may activate the NMOS transistor 112. The first complementary control signal having the low logic value may deactivate the NMOS transistor 112.

In various examples, the gate terminal of the PMOS transistor 114 may be electrically connected to the source terminal of the PMOS transistor 106. A second drive voltage corresponding to the second complementary control signal may be received at the gate terminal of the PMOS transistor 114. More specifically, the second drive voltage may be generated by the PMOS transistor 114 in response to receiving the second complementary control signal. The PMOS transistor 106 of the bootstrap circuit 104 may receive the second complementary control signal and provide the second drive signal to the PMOS transistor 114. In various examples, the second complementary control signal having the low logic value may activate the PMOS transistor 114. The second complementary control signal having the high logic value may deactivate the PMOS transistor 114.

It would be appreciated by one of ordinary skill in the art that the source and drain terminals of the PMOS transistors 106, 114, and the NMOS transistors 108, 112, may be interchangeable as a function of a voltage difference between the respective gate terminals and the respective source or drain terminals. In various examples, respective bias voltages applied to the PMOS transistors 106, 114 and the NMOS transistors 108, 112 may cause the PMOS transistors 106, 114 and the NMOS transistors 108, 112 to operate in a forward biased state or reverse biased state, depending on whether a respective gate voltage is higher or lower than the source or drain voltage, without departing from the scope of the present disclosure. In various examples, the PMOS transistors 106, 114 and the NMOS transistors 108, 112 may be fin field-effect transistors (FinFETs), without limitation.

In various examples, the bootstrap circuit 104 may increase respective drive gains of the NMOS transistor 112 and the PMOS transistor 114. The PMOS transistor 106 and the NMOS transistor 108 may control an amount of voltage supplied to the gate terminals of the PMOS transistor 114 and the NMOS transistor 112, respectively. The NMOS transistor 108 and the PMOS transistor 106 may continuously receive power from the one or more power supplies 124 and may provide the first and second drive voltages to the NMOS transistor 112 and the PMOS transistor 114 in response to receiving the first and second complementary control signals. The NMOS transistor 108 and the PMOS transistor 106 may cause first and second capacitive couplings to form across the respective gate and source terminals of the NMOS transistor 112 and the PMOS transistor 114, respectively, in response to signal transitions of the input signal.

The signal transitions of the input signal may include a rise and a fall. The rise may correspond to a voltage increase of the input signal. In various examples, the input signal may rise from a low voltage level to a high voltage level. The high voltage level may be greater than the low voltage level. In various examples, the high voltage level may correspond to a source voltage $V_{dd}$, without limitation. In various examples, the low voltage level may be equivalent to a ground voltage, or 0V, without limitation. The fall may correspond to a voltage decrease of the input signal. The decrease may be from the high voltage level to the low voltage level. The rise may be associated with a rise time. The rise time may correspond to a time period beginning when the input signal begins increasing in voltage from the low voltage level and ending when the input signal reaches the high voltage level. The fall time may correspond to a time period beginning when the input signal begins decreasing in voltage from the high voltage level and ending when the input signal reaches the low voltage level. In various examples, the input signal may be received at the input terminal 116. In various examples, the input signal may be a continuous signal, without limitation.

The first capacitive coupling may be formed between the gate and source terminals of NMOS transistor 112 in response to receiving the first drive voltage at the NMOS transistor 112. The first drive voltage may be supplied to the NMOS transistor 112 before the input signal is received. The NMOS transistor 108 may shut off after supplying the drive voltage to the NMOS transistor 112 due to equivalent gate voltages at the NMOS transistors 108, 112. The shut off of the NMOS transistor 108 may trap a charge at the gate of the NMOS transistor 112, causing the first capacitive coupling to form. When the input signal is received, the capacitive coupling may cause the gate voltage of the NMOS transistor 112 to increase and decrease by a same amount as, or proportional to, the rise and fall of the input signal. The increase and decrease of the gate voltage of the NMOS transistor 112 in proportion to the input signal may cause a first constant voltage value to be maintained across the gate and source terminals of the NMOS transistor 112. Accordingly, signal leakage associated with the rise and fall times of the input signal may be minimized and switching times may be reduced.

The second capacitive coupling may be formed between the gate and source terminals of PMOS transistor 114 in response to receiving the second drive voltage at the PMOS transistor 114. The second drive voltage may be supplied to the PMOS transistor 114 before the input signal is received. The PMOS transistor 106 may shut off after supplying the second drive voltage to the PMOS transistor 114 due to equivalent gate voltages at the PMOS transistors 106, 114. The shut off of the PMOS transistor 108 may trap a charge at the gate of the PMOS transistor 114, causing the second capacitive coupling to form. When the input signal is received, the second capacitive coupling may cause the gate voltage of the PMOS transistor 114 to increase and decrease by a same amount as, or proportional to, the rise and fall of the input signal. The increase and decrease of the gate voltage of the PMOS transistor 114 in proportion to the input signal may cause a second constant voltage value to be maintained across the gate and source terminals of the PMOS transistor 114. Accordingly, signal leakage associated with the rise and fall times of the input signal may be minimized and switching times may be reduced.

The respective capacitive couplings may cause respective gate voltages of the NMOS transistor 112 and the PMOS transistor 114 to increase or decrease in proportion to the rise and fall of the input signal received at the input terminal 116. More specifically, as the input signal increases from 0V to $V_{dd}$, the respective gate voltages of the NMOS transistor 112 and the PMOS transistor 114 may increase by the same amount as the input signal, or $V_{dd}$. If the input signal decreased from Vdd to 0V The respective gate voltages of the NMOS transistor 112 and the PMOS transistor 114 may decrease by the same amount, or $-V_{dd}$.

In various examples, the input signal may initially be at the low voltage level and the gate voltage of the NMOS transistor 112 may be equivalent to the source voltage $V_{dd}$ due to the first drive voltage from the bootstrap circuit 104. As described above, after supplying the first drive voltage, the NMOS transistor 108 may be turned off before the input signal is received, causing a first charge to be trapped at the gate of the NMOS transistor 112. The first trapped charge may cause the first capacitive coupling to form. As the input signal rises from the low voltage level to the high voltage level, the first capacitive coupling causes the gate voltage of the NMOS transistor 112 to increase in proportion with the voltage increase of the input signal. As the input signal reaches the source voltage $V_{dd}$, the gate voltage of the NMOS transistor 112 may be $2V_{dd}$. Accordingly, the first capacitive coupling may maintain the first constant voltage value across the source and gate terminals of the NMOS transistor 112.

When the input signal begins to fall from $V_{dd}$ to 0V, the gate voltage of the PMOS transistor 114 may be equal to 0V and may decrease in proportion to the fall of the input signal. As described above, after supplying the second drive voltage, the PMOS transistor 106 may be turned off before the input signal is received, causing a second charge to be trapped at the gate of the PMOS transistor 114. The second trapped charge may cause the second capacitive coupling to form. As the input signal falls, the gate voltage of the PMOS transistor 114 may decrease, or be coupled down, by an amount of voltage equivalent to the fall of the input signal. As the input signal reaches 0V, the gate voltage of the PMOS transistor 114 may be $-V_{dd}$. Accordingly, the second capacitive coupling may maintain the second constant voltage value across the source and gate terminals of the NMOS transistor 112.

In various examples, the NMOS transistor 112 and the PMOS transistor 114 are being over-driven as the input signal rises and falls by the first and second capacitive couplings formed in response to receiving the first and second drive voltages. First and second gate-source voltages $V_{gs}$, of the NMOS transistor 112 and the PMOS transistor 114, may be maintained at the first and second constant voltage levels, respectively, due to the first and second drive voltages from the bootstrap circuit 104 causing the first and second capacitive couplings to be formed. In various examples, the gate-source voltage of the NMOS transistor 112 may be maintained at $V_{dd}$. The gate-source voltage of the PMOS transistor 114 may be maintained at $-V_{dd}$. Maintaining the gate-source voltage at the first and second constant levels may reduce signal leakage, such as subthreshold leakage, associated with rise and fall times of the input signal, increase the drive gain of the CMOS pass gate circuit 110, and reduce a switching time associated with signal transitions of the input signal.

Figure 2:
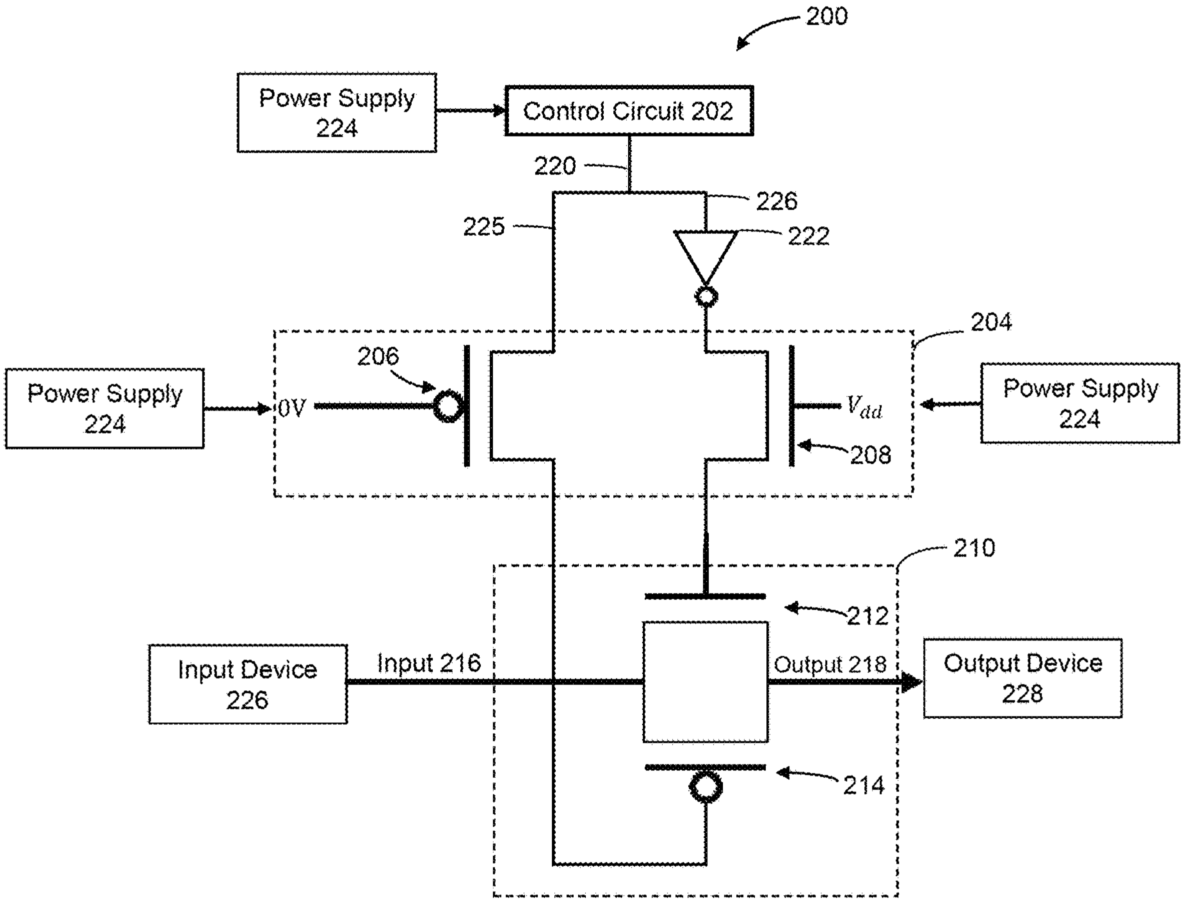
FIG. 2 illustrates an example CMOS device having a bootstrap circuit and a second control circuit configuration.

FIG. 2 illustrates a CMOS device 200 including a control circuit 202, a bootstrap circuit 204, a CMOS pass gate circuit 210, an input terminal 216, an output terminal 218, and one or more power supplies 224. The CMOS device 200 may receive an input signal from an input device 226 and provide an output signal to an output device 228. The output signal may include data to be provided to the output device 228. In various examples, the input device 226 may be a reprogrammable device. In various examples, the reprogrammable device may be an FPGA, FPSLIC, PLD, one or more multiplexors, or another type of reprogrammable device, without limitation. In various examples, the input device 226 and the output device 228 may be additional CMOS devices 200. In various examples, the input device 226 may be a memory device or a reprogrammable device, without limitation. In various examples, the output device 226 may be a memory device or a reprogrammable device. In various examples, the memory device may be a RAM, SRAM, serial SRAM, NVRAM, SPI flash memory, NVSRAM, or other NVM type circuit, without limitation. In various examples, the CMOS device 200, the input device 226, and the output device 228 may be integrated into one or more reprogrammable devices.

In various examples, the control circuit 202 may be a memory device for configuring one or more FPGAs, such as a RAM, SRAM, serial SRAM, NVRAM, SPI flash memory, NVSRAM, or other NVM type circuit, without limitation. The control circuit 202 may configure or reprogram one or more reprogrammable devices, such as an FPGA, FPSLIC, or PLD, without limitation. The control circuit 202 may be electrically connected to one or more power supplies 224. The one or more power supplies 224 may provide electric power to the control circuit 202. In various examples, the one or more power supplies 224 connected to the control circuit 202 may or may not be the same as the one or more power supplies 224 electrically connected to the bootstrap circuit 204. In various examples, the one or more power supplies 224 may be a voltage rail or voltage bus, without limitation.

In various examples, the CMOS pass gate circuit 210 includes a first n-channel transistor 212 and a first p-channel transistor 214. The first n-channel transistor 212 may be an NMOS transistor and the first p-channel transistor 214 may be a PMOS transistor. In various examples, the bootstrap circuit 204 includes a second p-channel transistor 206 and a second n-channel transistor 208. In various examples, the second p-channel transistor 206 may be a PMOS transistor and the second n-channel transistor 208 may be an NMOS transistor.

The PMOS transistor 206 includes a gate terminal, a source terminal, and a drain terminal. The gate terminal of the PMOS transistor 206 may be electrically connected to the one or more power supplies 224, as described above. The drain terminal of the PMOS transistor 206 may be electrically connected to the control circuit 202. The NMOS transistor 208 includes a gate terminal, a source terminal, and a drain terminal. The gate terminal of the NMOS transistor 208 may be electrically connected to the one or more power supplies 224, as described above. The drain terminal of the NMOS transistor 208 may be electrically connected to the control circuit 202. The gate, source, and drain terminals of the NMOS transistor 208 and PMOS transistor 206 are described in detail below with reference to FIG. 4. In various examples, the one or more power supplies may activate the bootstrap circuit 204 by supplying 0V the gate terminal of the PMOS transistor 206 and the source voltage $V_{dd}$ to the gate terminal of the NMOS transistor 208.

In various examples the NMOS transistor 212 includes a gate terminal, a source terminal, and a drain terminal. The PMOS transistor 214 includes a gate terminal, a source terminal, and a drain terminal. The source terminal of the PMOS transistor 214 and the source terminal of the NMOS transistor 212 may be electrically connected to the input terminal 216. The drain terminal of the PMOS transistor 214 and the drain terminal of the NMOS transistor 212 may be electrically connected to the output terminal 218. The gate, source, and drain terminals of the NMOS transistor 212 and PMOS transistor 214 are described in detail below with reference to FIG. 3.

The control circuit 202 may include a control circuit output terminal 220. The control circuit 202 may generate a control signal for activating or deactivating the CMOS pass gate circuit 210. The control signal may be provided to the control circuit output terminal 220. The control signal may include a logic high value or a logic low value. The control signal may be split into a first signal path 225 and a second signal path 226. The second signal path 226 may include a logic inverter 222. The logic inverter 222 may invert the control signal from the logic high value to the logic low value, or vice versa. The second signal path 226 may provide a first complementary control signal to the bootstrap circuit 204. The first signal path 225 may provide a second complementary control signal to the bootstrap circuit 204. The first complementary control signal may activate or deactivate the NMOS transistor 212. The second complementary control signal may activate or deactivate the PMOS transistor 214. The control circuit output terminal 220 may convey the control signal to the first signal path 225 and the second signal path 226. The inverter 222 may invert the control signal received in the second signal path 226, such that the first signal path 225 provides the second complementary control signal, and the second signal path 226 provides the first complementary control signal, to the bootstrap circuit 204. The bootstrap circuit 204 may generate the first and second drive voltage in response to receiving the first and second complementary control signals and convey the first and second drive voltages to the CMOS pass gate circuit 210.

It would be appreciated by one of ordinary skill in the art that either the first signal path 225 or the second signal path 226 could include the logic inverter 222 without departing from the scope of the present disclosure. The logic inverter 222 may decrease power consumption, operating costs, and improve efficiency associated with the control circuit 202 by reducing the number of control signals produced by the control circuit 202. It should be understood that all features, concepts, structures and operations discussed throughout in connection with the examples shown in FIGS. 1-6 can be used in any combination, and that the addition or omission of an inverter (e.g., inverter 222) from a control circuit output signal path (compare FIGS. 1 and 2) does not alter the commutability of these features, concepts, structures and operations, given that one of ordinary skill will readily understand how inversion of the signal by such a component impacts operation of the example circuits.

In various examples, the first and second complementary control signals received by the NMOS transistor 208 and PMOS transistor 206, respectively, may have complementary values. In a first state, the first complementary control signal may include the logic low value and the second complementary control signal may include the logic high value. The first state of the control signal may activate the CMOS pass gate circuit 210. In a second state, the first complementary control signal may include the logic high value and the second complementary control signal may include the logic low value. The second state of the control signal may deactivate the CMOS pass gate circuit 210. In various examples, the logic high value may be equivalent to a source voltage $V_{dd}$. The logic low value may be equivalent to a ground voltage. In various examples, the source voltage $V_{dd}$ may be 0.75V, 0.85V, 1.5V, or another voltage, without limitation. The ground voltage may be 0V, without limitation.

In various examples, PMOS transistor 206 and NMOS transistor 208 may be electrically connected to one or more power supplies 224. The one or more power supplies 224 may activate the bootstrap circuit 204. The one or more power supplies 224 may supply the source voltage $V_{dd}$ to a gate terminal of the NMOS transistor 208 and the ground voltage to a gate terminal of the PMOS transistor 206.

In various examples, the gate terminal of the NMOS transistor 212 may be electrically connected to the source terminal of the NMOS transistor 208. A first drive voltage corresponding to the first complementary control signal may be received at the gate terminal of the NMOS transistor 212. The NMOS transistor 208 of the bootstrap circuit 204 may receive the first complementary control signal and provide the first drive voltage to the NMOS transistor 212. The first drive voltage may correspond to the first complementary control signal. The bootstrap circuit 204 may increase a first drive gain of the NMOS transistor 208 based on, at least in part, the value of the first complementary control signal. The first complementary control signal may activate or deactivate the NMOS transistor 212. The first complementary control signal having the high logic value may activate the NMOS transistor 212. The first complementary control signal having the low logic value may deactivate the NMOS transistor 212.

In various examples, the gate terminal of the PMOS transistor 214 may be electrically connected to the source terminal of the PMOS transistor 206. A second drive voltage corresponding to the second complementary control signal may be received at the gate terminal of the PMOS transistor 214. The PMOS transistor 206 of the bootstrap circuit 204 may receive the second complementary control signal and provide the second drive signal to the PMOS transistor 214. The second drive voltage may correspond to the second complementary control signal. In various examples, the second complementary control signal having the low logic value may activate the PMOS transistor 214. The second complementary control signal having the high logic value may deactivate the PMOS transistor 214.

It would be appreciated by one of ordinary skill in the art that the source and drain terminals of the PMOS transistors 206, 214, and the NMOS transistors 208, 212, may be interchangeable as a function of a voltage difference between the respective gate terminals and the respective source or drain terminals. In various examples, respective bias voltages applied to the PMOS transistors 206, 214 and the NMOS transistors 208, 212 may cause the PMOS transistors 206, 214 and the NMOS transistors 208, 212 to operate in a forward biased state or reverse biased state, depending on whether a respective gate voltage is higher or lower than a the source or drain voltage, without departing from the scope of the present disclosure. In various examples, the PMOS transistors 206, 214 and the NMOS transistors 208, 212 may be FinFETs, without limitation.

In various examples, the bootstrap circuit 204 may increase respective drive gains of the NMOS transistor 212 and the PMOS transistor 214. The PMOS transistor 206 and the NMOS transistor 208 may control an amount of voltage supplied to the gate terminals of the PMOS transistor 214 and the NMOS transistor 212, respectively. The NMOS transistor 208 and the PMOS transistor 206 may continuously receive power from the one or more power supplies 224 and may provide the first and second drive voltages to the NMOS transistor 212 and the PMOS transistor 214 in response to receiving the first and second complementary control signals. The NMOS transistor 208 and the PMOS transistor 206 may cause first and second capacitive couplings to form across the respective gate and source terminals of the NMOS transistor 212 and the PMOS transistor 214, respectively, in response to signal transitions of the input signal.

The signal transitions of the input signal may include a rise and a fall. The rise may correspond to a voltage increase of the input signal. In various examples, the input signal may rise from a low voltage level to a high voltage level. The high voltage level may be greater than the low voltage level. In various examples, the high voltage level may correspond to a source voltage $V_{dd}$, without limitation. In various examples, the low voltage level may be equivalent to a ground voltage, or 0V, without limitation. The fall may correspond to a voltage decrease of the input signal. The decrease may be from the high voltage level to the low voltage level. The rise may be associated with a rise time. The rise time may correspond to a time period beginning when the input signal begins increasing in voltage from the low voltage level and ending when the input signal reaches the high voltage level. The fall time may correspond to a time period beginning when the input signal begins decreasing in voltage from the high voltage level and ending when the input signal reaches the low voltage level. In various examples, the input signal may be received at the input terminal 216. In various examples, the input signal may be a continuous signal, without limitation.

The first capacitive coupling may be formed between the gate and source terminals of NMOS transistor 212 in response to receiving the first drive voltage at the NMOS transistor 212. The first drive voltage may be supplied to the NMOS transistor 212 before the input signal is received. The NMOS transistor 208 may shut off after supplying the drive voltage to the NMOS transistor 212 due to equivalent gate voltages at the NMOS transistors 208, 212. The shut off of the NMOS transistor 208 may trap a charge at the gate of the NMOS transistor 212, causing the first capacitive coupling to form. When the input signal is received, the capacitive coupling may cause the gate voltage of the NMOS transistor 212 to increase and decrease by a same amount as, or proportional to, the rise and fall of the input signal. The increase and decrease of the gate voltage of the NMOS transistor 212 in proportion to the input signal may cause a first constant voltage value to be maintained across the gate and source terminals of the NMOS transistor 212. Accordingly, signal leakage associated with the rise and fall times of the input signal may be minimized and switching times may be reduced.

The second capacitive coupling may be formed between the gate and source terminals of PMOS transistor 214 in response to receiving the second drive voltage at the PMOS transistor 214. The second drive voltage may be supplied to the PMOS transistor 214 before the input signal is received. The PMOS transistor 206 may shut off after supplying the second drive voltage to the PMOS transistor 214 due to equivalent gate voltages at the PMOS transistors 206, 214. The shut off of the PMOS transistor 208 may trap a charge at the gate of the PMOS transistor 214, causing the second capacitive coupling to form. When the input signal is received, the second capacitive coupling may cause the gate voltage of the PMOS transistor 214 to increase and decrease by a same amount, or in proportion to, the rise and fall of the input signal. The increase and decrease of the gate voltage of the PMOS transistor 214 in proportion to the input signal may cause a second constant voltage value to be maintained across the gate and source terminals of the PMOS transistor 214. Accordingly, signal leakage associated with the rise and fall times of the input signal may be minimized and switching times may be reduced.

The respective capacitive couplings may cause respective gate voltages of the NMOS transistor 212 and the PMOS transistor 214 to increase or decrease in proportion to the rise and fall of the input signal received at the input terminal 216. More specifically, as the input signal increases from 0V to $V_{dd}$, the respective gate voltages of the NMOS transistor 212 and the PMOS transistor 214 may increase by the same amount as the input signal, or $V_{dd}$. If the input signal decreased from Vdd to 0V The respective gate voltages of the NMOS transistor 212 and the PMOS transistor 214 may decrease by the same amount, or $-V_{dd}$.

In various examples, the input signal may initially be at the low voltage level and the gate voltage of the NMOS transistor 212 may be equivalent to the source voltage $V_{dd}$ due to the first drive voltage from the bootstrap circuit 204. As described above, after supplying the first drive voltage, the NMOS transistor 208 may be turned off before the input signal is received, causing a first charge to be trapped at the gate of the NMOS transistor 212. The first trapped charge may cause the first capacitive coupling to form. As the input signal rises from the low voltage level to the high voltage level, the first capacitive coupling causes the gate voltage of the NMOS transistor 212 to increase in proportion to the rise of the input signal. As the input signal reaches the source voltage $V_{dd}$, the gate voltage of the NMOS transistor 212 may be $2V_{dd}$. Accordingly, the first capacitive coupling may maintain the first constant voltage value across the source and gate terminals of the NMOS transistor 212.

When the input signal begins to fall from $V_{dd}$ to 0V, the gate voltage of the PMOS transistor 214 may be equal to 0V and may decrease in proportion to the fall of the input signal. As described above, after supplying the second drive voltage, the PMOS transistor 206 may be turned off before the input signal is received, causing a second charge to be trapped at the gate of the PMOS transistor 214. The second trapped charge may cause the second capacitive coupling to form. As the input signal falls, the gate voltage of the PMOS transistor 214 may decrease, or be coupled down, by an amount of voltage equivalent to the fall of the input signal. As the input signal reaches 0V, the gate voltage of the PMOS transistor 214 may be $-V_{dd}$. Accordingly, the second capacitive coupling may maintain the second constant voltage value across the source and gate terminals of the NMOS transistor 212.

In various examples, the NMOS transistor 212 and the PMOS transistor 214 are being over-driven as the input signal rises and falls by the first and second capacitive couplings formed in response to receiving the first and second drive voltages. First and second gate-source voltages $V_{gs}$, of the NMOS transistor 212 and the PMOS transistor 214 may be maintained at the first and second constant voltage levels, respectively, due to the first and second drive voltages from the bootstrap circuit 204 causing the first and second capacitive couplings to be formed. In various examples, the gate-source voltage of the NMOS transistor 212 may be maintained at $V_{dd}$. The gate-source voltage of the PMOS transistor 214 may be maintained at $-V_{dd}$. Maintaining the gate-source voltage at the first and second constant levels may reduce signal leakage, such as sub-threshold leakage, associated with rise and fall times of the input signal, increase the drive gain of the CMOS pass gate circuit 210, and reduce a switching time associated with signal transitions of the input signal.

Figure 3:
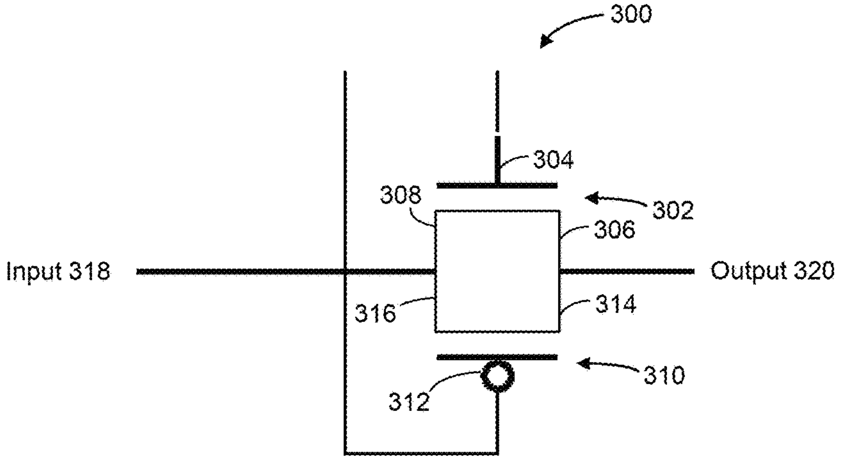
FIG. 3 illustrates an example CMOS pass gate circuit in accordance with the CMOS device of FIG. 1 or the CMOS device of FIG. 2.

FIG. 3 illustrates a CMOS pass gate circuit 300. In various examples, the CMOS pass gate circuit 300 may correspond to the CMOS pass gate circuit 110 of FIG. 1 or the CMOS pass gate circuit 210 of FIG. 2. The CMOS pass gate circuit 300 includes an NMOS transistor 302 and a PMOS transistor 310. The NMOS transistor 302 includes a gate terminal 304, a source terminal 308, and a drain terminal 306. The PMOS transistor 310 includes a gate terminal 312, a drain terminal 314, and a source terminal 316.

It would be appreciated by one of ordinary skill in the art that the source terminals 308, 316 may respectively be interchangeable with the drain terminals 306, 316, as a function of a voltage difference between the respective gate terminals and the respective source or drain terminals. In various examples, respective bias voltages applied to the NMOS transistor 302 and the PMOS transistor 310 may cause the he NMOS transistor 302 and the PMOS transistor 310 operate in a forward biased state or reverse biased state, depending on whether a respective gate voltage is higher or lower than a the source or drain voltage, without departing from the scope of the present disclosure. In various examples, the NMOS transistor 302 and the PMOS transistor 310 may be FinFETs, without limitation.

In various examples, the source terminals 308, 316 may be electrically connected to an input terminal 318. The drain terminals 306, 314 may be electrically connected to an output terminal 320. The CMOS pass gate circuit 300 may receive an input signal at the input terminal 318 and provide an output signal to the output terminal 320 when the NMOS transistor 302 and the PMOS transistor 310 are activated.

The gate terminals 304, 312 may be electrically connected to a bootstrap circuit, such as the bootstrap circuit 110 (shown in FIG. 1) or the bootstrap circuit 210 (shown in FIG. 2) and the respective bootstrap circuit electrically connected to a control circuit, such as the control circuit 102 (shown in FIG. 1) or the control circuit 202 (shown in FIG. 2). Control signals for activating the CMOS pass gate circuit 300 may be received by the bootstrap circuit. The bootstrap circuit may provide first and second drive voltages to the gate terminals 304, 312. The first and second drive voltages may correspond to the control signals. The first and second drive voltages may cause respective charges to be trapped at the gate terminals 304, 314 before the input signal is received, forming first and second capacitive couplings, as described above with reference to FIG. 1 and FIG. 2. In various examples, the control signals may include complementary control signals, as described above with reference to FIG. 1 and FIG. 2.

In various examples, the first and second drive voltages from the bootstrap circuit may be received at the gate terminals 304, 312. The first and second drive voltages may cause the first and second capacitive couplings to be formed between the gate terminals 304, 312, and the source terminals 308, 316, respectively, as described above with reference to FIG. 1 and FIG. 2. The NMOS transistor 302 and the PMOS transistor 310 may be over-driven in response to receiving the input signal. The first and second capacitive couplings may cause respective gate voltages at the gate terminals 304, 312 to increase and decrease in proportion to the voltage level of the input signal. The first capacitive coupling may be formed between the gate terminal 304 and the source terminal 308. The second capacitive coupling may be formed between the gate terminal 312 and the source terminal 316. The first capacitive coupling may cause a voltage across the gate terminal 304 to increase and decrease in proportion to the rise and fall of the voltage level of the input signal. The second capacitive coupling may cause a voltage level across the gate terminal 312 to increase and decrease in proportion to the rise and fall of the voltage level of the input signal. In various examples, "in proportion" may refer to the respective gate voltages increasing or decreasing by a same amount of voltage as the input signal.

As described above with reference to FIG. 1 and FIG. 2, the first and second capacitive couplings may cause respective constant voltage values to be maintained across the respective gate terminals 304, 312 and source terminals 308, 316, of the NMOS transistor 302 and the PMOS transistor 312. In various examples, the first and second constant voltage values may refer to constant gate-source voltages of the NMOS transistor 302 and the PMOS transistor 310 to be maintained as the voltage level of the input signal increases or decreases. The constant gate-source voltages may reduce signal leakage, such as sub-threshold leakage, associated with rise and fall times of the input signal and may increase the drive gain of the CMOS pass gate circuit 300.

Figure 4:
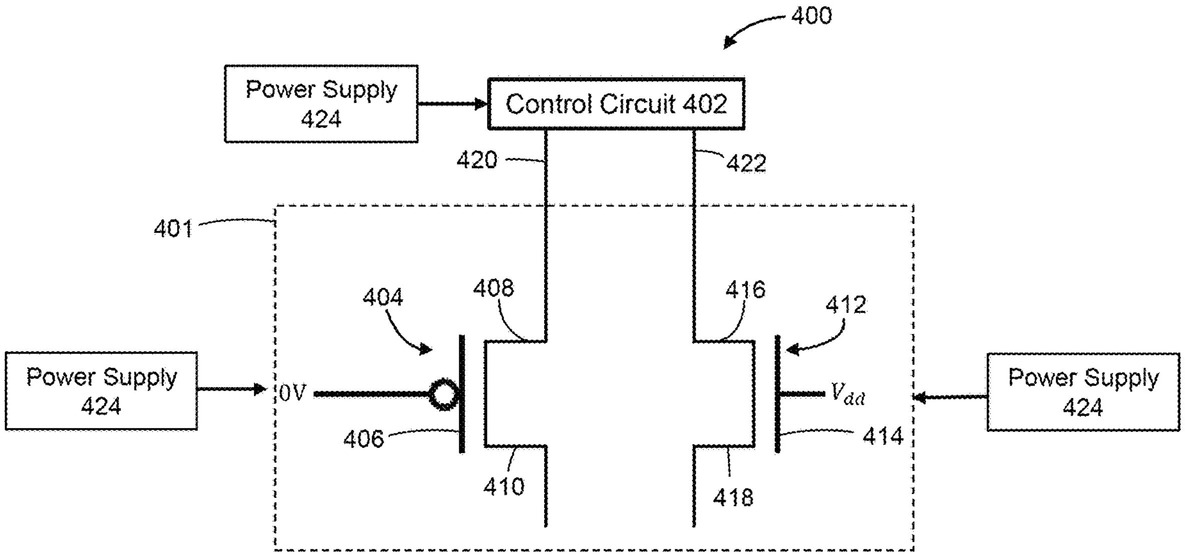
FIG. 4 illustrates an example bootstrap circuit in accordance with the CMOS device of FIG. 1 or the CMOS device of FIG. 2.

FIG. 4 illustrates a circuit 400 including a bootstrap circuit 401 and a control circuit 402. In various examples, the bootstrap circuit 401 may correspond to the bootstrap circuit 104 (shown in FIG. 1) or the bootstrap circuit 204 (shown in FIG. 2), without limitation. The control circuit 402 may correspond to the control circuit 102 (shown in FIG. 1) or the control circuit 202 (shown in FIG. 2), without limitation. The bootstrap circuit 401 may be electrically connected to one or more power supplies 424 and a CMOS pass gate circuit. In various examples, the bootstrap circuit 401 may provide first and second drive voltages to the CMOS pass gate circuit. The CMOS pass gate circuit may be the CMOS pass gate circuit 110 (shown in FIG. 1), the CMOS pass gate circuit 210 (shown in FIG. 2), or the CMOS pass gate circuit 300 (shown in FIG. 3), without limitation. The bootstrap circuit 401 may receive one or more control signals and generate the first and second drive voltages. The first and second drive voltages may correspond to the one or more control signals.

In various examples, the bootstrap circuit 401 may include a PMOS transistor 404 and an NMOS transistor 412.

The PMOS transistor 404 may include a gate terminal 406, a drain terminal 408, and a source terminal 410. The NMOS transistor 412 may include a gate terminal 414, a drain terminal 416, and a source terminal 418. The drain terminals 408, 416 may be electrically connected to the control circuit 402. The source terminals 410, 418 may be electrically connected to the CMOS pass gate circuit. The gate terminals 406, 414 may be electrically connected to the one or more power supplies 424. In various examples, the one or more power supplies 424 may be a voltage rail or voltage bus, without limitation.

The gate terminals 406, 414 may receive electric power from the one or more power supplies 424. In various examples, the one or more power supplies 424 may activate the bootstrap circuit 401 by supplying 0V the gate terminal 406 of the PMOS transistor 404 and the source voltage $V_{dd}$ to the gate terminal 414 of the NMOS transistor 412. Upon receiving electric power at the gate terminals 406, 414, the bootstrap circuit 401 may be activated. The bootstrap circuit 401 may receive complementary control signals from the control circuit 402 at the drain terminals 408, 416. The source terminals 410, 418 may provide the first and second drive voltages to the CMOS pass gate circuit in response to receiving the complementary control signals. As described above with reference to FIGS. 1 and 2, the NMOS transistor 412 may be shut off when an input signal is at a high voltage level. The PMOS transistor 404 may be shut off when the input signal is at a low voltage level. Accordingly, the bootstrap circuit 401 may increase a drive gain of the CMOS pass gate circuit by trapping charges in the CMOS pass gate circuit.

In various examples, the source voltage $V_{dd}$ may be supplied to the gate terminal 414 by the one or more power supplies 424. The ground voltage or 0V may be supplied to the gate terminal 406 by the one or more power supplies 424. The source terminal 418 may provide the first drive voltage to the CMOS pass gate circuit. The source terminal 410 may provide the second drive voltage to the CMOS pass gate circuit.

It would be appreciated by one of ordinary skill in the art that the source terminals 410, 418 may be interchangeable with the drain terminals 408, 416, respectively, as a function of a voltage difference between the respective gate terminals and the respective source or drain terminals. In various examples, respective bias voltages applied to the NMOS transistor 412 and the PMOS transistor 404 may cause the NMOS transistor 412 and the PMOS transistor 404 to operate in a forward biased state or reverse biased state, depending on whether a respective gate voltage is higher or lower than the source or drain voltage, without departing from the scope of the present disclosure. In various examples, the NMOS transistor 412 and the PMOS transistor 404 may be FinFETs, without limitation.

Figure 5:
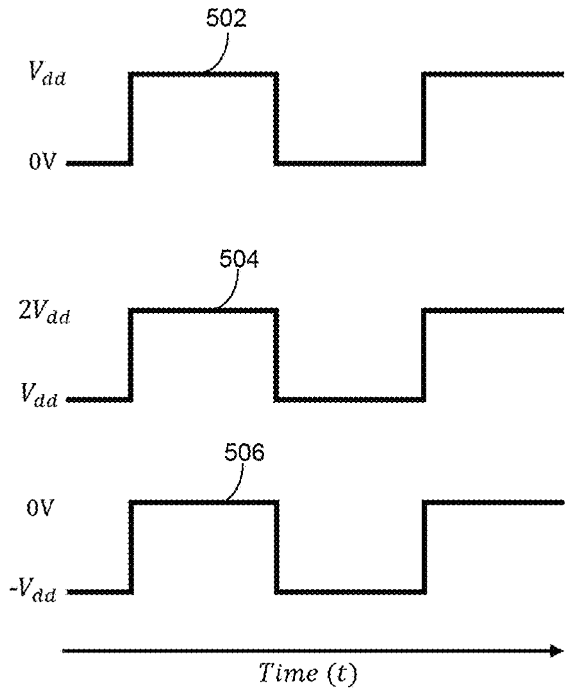
FIG. 5 is a diagram illustrating various voltage levels across a CMOS pass gate circuit in accordance with the CMOS device of FIG. 1, the CMOS device of FIG. 2, or the CMOS pass gate circuit of FIG. 3.

FIG. 5 illustrates various operational voltage levels across a CMOS pass gate circuit with respect to time. The voltage levels include an input signal voltage 502, an NMOS transistor gate voltage 504, and a PMOS transistor gate voltage 506. In various examples, the CMOS pass gate circuit and corresponding components in which the voltage levels illustrated in FIG. 5 occur may correspond to the CMOS pass gate circuit 110 (shown in FIG. 1), the CMOS pass gate circuit 210 (shown in FIG. 2), or the CMOS pass gate circuit 300 (shown in FIG. 3), without limitation. The NMOS transistor gate voltage 504 and the PMOS transistor gate voltage 506 may correspond to gate voltages of a first n-channel transistor and a first p-channel transistor, respectively. The first n-channel transistor may be the NMOS transistor 112, the NMOS transistor 212, or the NMOS transistor 302, without limitation. The first p-channel transistor may be the PMOS transistor 114, the PMOS transistor 214, or the PMOS transistor 310, without limitation. The first n-channel transistor and the first p-channel transistor may receive first and second drive voltages from a bootstrap circuit, such as the bootstrap circuit 104, the bootstrap circuit 204, or the bootstrap circuit 401, without limitation. The first drive voltages may over-drive the gates of the first n-channel transistor and the first p-channel transistor, thereby increasing a drive gain of the CMOS pass gate circuit, as described above with reference to FIGS. 1-3.

The input signal voltage 502 may correspond to one or more voltage levels of an input signal, such as the input signal received at the input terminal 116, the input terminal 216, or the input terminal 318. The input signal may alternate between the ground voltage and the source voltage $V_{dd}$. In various examples, the input signal may be associated with a rise time and a fall time. The rise time may correspond to a time period in which the signal increases from the ground voltage to $V_{dd}$. The fall time may correspond to a time period in which the signal decreases from $V_{dd}$ to the ground voltage. It would be appreciated by one of ordinary skill in the art that although the voltage rise and fall of the input signal are shown to be instantaneous in the form of a square wave, the voltage rise and fall of the input signal would not be instantaneous in practice.

The NMOS transistor gate voltage 504 illustrates one or more gate voltage levels of the first n-channel transistor of the CMOS pass gate circuit. The NMOS transistor gate voltage 504 may be equal to the source voltage $V_{dd}$ when the input signal voltage 502 is at the ground voltage, due to the first drive voltage received from the bootstrap circuit. In various examples, the ground voltage may be 0V. In various examples, the first drive voltage may be equal to the source voltage $V_{dd}$. As described above with reference to FIGS. 1-3, a first capacitive coupling may be formed between gate and source terminals of the first n-channel transistor. As the input signal increases from 0V to the source voltage $V_{dd}$, the NMOS gate voltage 504 increases in proportion to the input signal due to the first capacitive coupling. When the input signal reaches the source voltage $V_{dd}$, the NMOS gate voltage 504 may be equal to $2V_{dd}$. Similarly, as the input signal voltage 502 decreases from $V_{dd}$ to the ground voltage, the NMOS gate voltage 504 may decrease from $2V_{dd}$ to $V_{dd}$ in proportion to the input signal voltage 502.

The PMOS transistor gate voltage 506 illustrates one or more gate voltage levels of the first p-channel transistor of the CMOS pass gate circuit. In various examples, the first p-channel transistor may correspond to the PMOS transistor 114, the PMOS transistor 214, or the PMOS transistor 310, without limitation. The PMOS transistor gate voltage 506 may be equal to $-V_{dd}$ when the input signal voltage decreases to the ground voltage, due to a second capacitive coupling formed between gate and source terminals of the first p-channel transistor in response to receiving the second drive voltage from the bootstrap circuit, as described above with reference to FIGS. 1-3. In various examples, the second drive voltage may be equal to the ground voltage. As the input signal voltage 502 increases from 0V to the source voltage $V_{dd}$, the PMOS gate voltage 506 may increase in proportion to the input signal. When the input signal voltage 502 reaches the source voltage $V_{dd}$, the PMOS gate voltage 506 may be equal to 0V. Similarly, as the input signal voltage 502 decreases from the source voltage $V_{dd}$ to the ground voltage, the PMOS gate voltage 506 may decrease from the source voltage 0V to $-V_{dd}$ in proportion to the input signal voltage 502.

Figure 6:
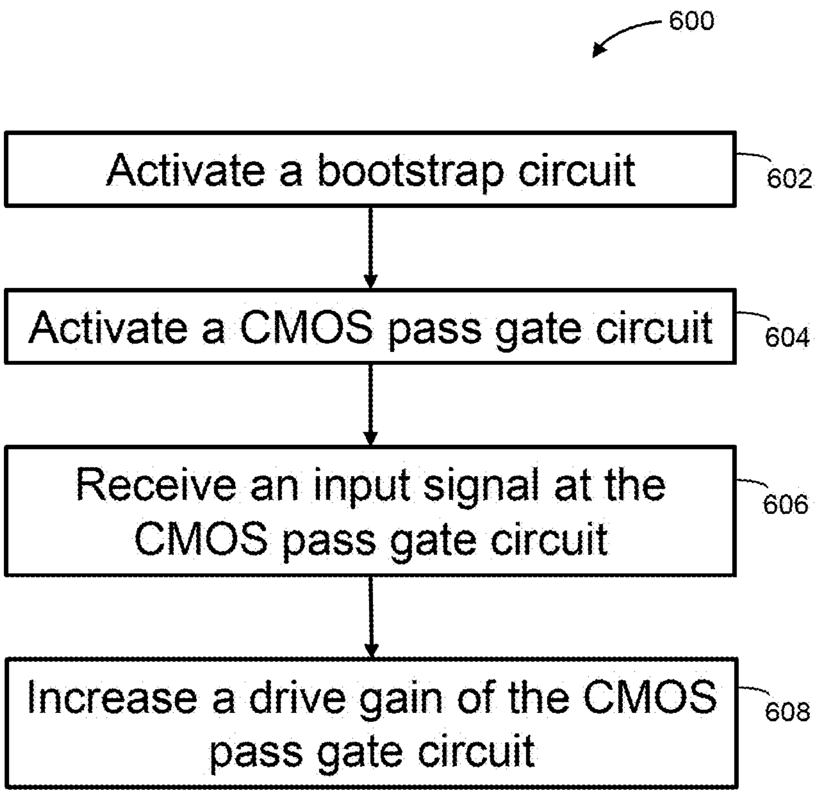
FIG. 6 is a flowchart diagram illustrating an example method performed by the CMOS device of FIG. 1 or the CMOS device of FIG. 2.

FIG. 6 illustrates a method 600 performed by a CMOS device, such as the CMOS device 100 or the CMOS device 200. The CMOS device may include a control circuit, a bootstrap circuit, a CMOS pass gate circuit, and one or more power supplies. At operation 602, the bootstrap circuit may be activated by the one or more power supplies. The bootstrap circuit may be activated when the one or more power supplies provide electrical power to respective gate terminals of the bootstrap transistors. The bootstrap transistors may include a second n-channel transistor and a second p-channel transistor. The second n-channel transistor may be the NMOS transistor 108, the NMOS transistor 208, or the NMOS transistor 412, without limitation. The second p-channel transistor may be the PMOS transistor 106, the PMOS transistor 206, or the PMOS transistor 404, without limitation.

At operation 604, the bootstrap circuit may activate the CMOS pass gate circuit. The control circuit may generate one or more control signals for activating the CMOS pass gate circuit, as described in reference to FIG. 1 and FIG. 2. The control circuit may convey the one or more control signals to the bootstrap circuit. The bootstrap circuit may generate first and second drive voltages based on the one or more control signals. The CMOS pass gate circuit may include a first n-channel transistor and a first p-channel transistor. The first n-channel transistor may be the NMOS transistor 112, the NMOS transistor 212, or the NMOS transistor 302, without limitation. The first p-channel transistor may be the PMOS transistor 114, the PMOS transistor 214, or the PMOS transistor 310, without limitation. The CMOS pass gate circuit may be activated by receiving the first and second drive voltages at respective gate terminals of the first n-channel transistor and PMOS transistor, as described with reference to FIGS. 1-3.

At operation 606, an input signal may be received by the first n-channel transistor and first p-channel transistor. In various examples, the input signal may be received at respective source terminals of the first n-channel transistor and first p-channel transistor. As noted above, the source and drain terminals of the first n-channel transistor and first p-channel transistor may be interchangeable as a function of respective bias voltages applied to gate terminals of the first n-channel transistor and first p-channel transistor, without limitation. The input signal may have or vary between a low voltage level and a high voltage level. The low voltage level may correspond to a ground voltage or 0V, without limitation. The high voltage level may correspond to a source voltage $V_{dd}$. The input signal may be associated with a rise period and a fall period. The rise period may correspond a first transition time in which the voltage of the input signal increases from the low voltage level to the high voltage level. The fall period may correspond to a second transition time in which the voltage of the input signal decreases from the high voltage level to the low voltage level.

At operation 608, the bootstrap circuit may increase a drive gain of the CMOS pass gate circuit. The second n-channel transistor may provide the first drive voltage to the first n-channel transistor based on the one or more control signals received from the control circuit. The first drive voltage may be received at the gate terminal of the first n-channel transistor. The second p-channel transistor may provide the second drive voltage to the first p-channel transistor. The second drive voltage may be received at the gate terminal of the first p-channel transistor.

A first capacitive coupling may be generated between the gate and source terminals of the first n-channel transistor in response to receiving the first drive voltage at the first n-channel transistor. The first capacitive coupling may cause a gate voltage of the first n-channel transistor to increase during each rise period. The first capacitive coupling may cause the gate voltage of the first n-channel transistor to decrease during each fall period. The increase and decrease of the gate voltage may be proportional to voltage increases and decreases of the input signal. The first capacitive coupling may cause a gate-source voltage of the first n-channel transistor to be maintained at a constant level during each rise period and fall period. Additionally, the gate-source voltage may be maintained at the constant level at all times during operation of the CMOS pass gate device.

A second capacitive coupling may be generated between the gate and source terminals of the first p-channel transistor in response to receiving the second drive voltage at the second p-channel transistor. The second capacitive coupling may cause a gate voltage of the first p-channel transistor to increase during each rise period. The second capacitive coupling may cause the gate voltage of the first p-channel transistor to decrease during each fall period. The increase and decrease of the gate voltage may be proportional to voltage increases and decreases of the input signal. The second capacitive coupling may cause a gate-source voltage of the first p-channel transistor to be maintained at a constant level during each rise period and fall period. Additionally, the gate-source voltage may be maintained at the constant level at all times during operation of the CMOS pass gate device.

The first and second drive voltages may cause the first n-channel transistor and first p-channel transistor to be over-driven when an input signal is received, thereby increasing a drive gain of the CMOS pass gate circuit. As a result, sub-threshold leakage associated with the rise and fall periods of the input signal may be significantly reduced. Furthermore, providing the first and second drive voltages to the CMOS pass gate circuit by the bootstrap circuit of the present disclosure may reduce an amount of time associated with activating the transistors of the CMOS pass gate circuit, thereby improving an overall efficiency of the CMOS pass gate circuit while maintaining low power consumption.

As discussed in more detail above, the CMOS device may receive the input signal from an input device and provide an output signal to an output device, pursuant to the operations of method 600. The output signal may include data to be provided to the output device. In various examples, the input device and output device may be an FPGA, FPSLIC, PLD, one or more multiplexors, or another type of reprogrammable device, without limitation. In various examples, the input device and the output device may be respective CMOS devices. In various examples, the CMOS device, the input device, and the output device may be integrated into a single reprogrammable device.

According to various examples of the present disclosure, an apparatus is provided that includes a CMOS pass gate circuit, a control circuit, and a bootstrap circuit. The CMOS pass gate circuit may include a first n-channel transistor and a first p-channel transistor. The control circuit may generate control signals to activate the CMOS pass gate circuit. The bootstrap circuit may be electrically connected between the CMOS pass gate circuit and the control gate circuit. The bootstrap circuit may increase a first drive gain of the first n-channel transistor and a second drive gain of the first p-channel transistor.

In combination with any of the above examples, the bootstrap circuit may include a second n-channel transistor and a second p-channel transistor. The second n-channel transistor may be electrically connected between the control circuit and the first n-channel transistor. The second p-channel transistor may be electrically connected between the control circuit and the first p-channel transistor. The second n-channel transistor may receive a first complementary control signal of the control signals and convey a first drive voltage corresponding to the first complementary control signal to the first n-channel transistor. The first drive voltage may increase the first drive gain of the first n-channel transistor. The second p-channel transistor may receive a second complementary control signal of the control signals and convey a second drive voltage corresponding to the second complementary control signal to the first p-channel transistor. The second drive voltage may increase the second drive gain.

In combination with any of the above examples the one or more control signals may be a control signal. The control circuit may include an output having a first signal path and a second signal path. The control signal may be split between the first signal path and the second signal path. The first signal path may be electrically connected to the second p-channel transistor. The second signal path may be electrically connected to the second n-channel transistor. The second signal path may include an inverter. The inverter may invert a control signal of the complementary control signal to generate the first complementary control signal.

In combination with any of the above examples, the control signals may include the first complementary control signal and the second complementary control signal. The control circuit may include a first output connected to the second n-channel transistor and a second output electrically connected to the second p-channel transistor. The first output may convey the first complementary control signal to the second n-channel transistor. The second output may convey the second complementary control signal to the second p-channel transistor.

In combination with any of the above examples, the apparatus may include an input terminal electrically connected to the CMOS pass gate circuit. The input terminal may convey an input signal to the CMOS pass gate circuit. The input signal may alternate between a high voltage level and a low voltage level. Respective ones of the first p-channel transistor, first n-channel transistor, second p-channel transistor, and second n-channel transistor may include a respective gate terminal, a respective source terminal, and a respective drain terminal. A first capacitive coupling is formed between the gate and source terminals of the first n-channel transistor. A second capacitive coupling to form between the gate and source terminals of the first p-channel transistor. The first and second capacitive couplings may be generated based on the first and second drive voltages, respectively.

In combination with any of the above examples, the first and second capacitive couplings may increase a first gate voltage of the first n-channel transistor and a second gate voltage of the first p-channel transistor in proportion to a rise of the input signal.

In combination with any of the above examples, the first and second capacitive couplings may decrease a first gate voltage of the first n-channel transistor and a second gate voltage of the first p-channel transistor in proportion to a fall of the input signal.

In combination with any of the above examples, the gate terminal of the first p-channel transistor may be electrically connected to the source terminal of the second p-channel transistor. The gate terminal of the first n-channel transistor may be electrically connected to the source terminal of the second n-channel transistor. The source terminals of the first p-channel transistor and the first n-channel transistor may be electrically connected to the input terminal. The gate terminals of the second p-channel transistor and the second n-channel transistor may be electrically connected to one or more power supplies. The drain terminals of the second p-channel transistor and the second n-channel transistor may be electrically connected to the control circuit.

According to various examples of the present disclosure, a circuit arrangement may be provided. The circuit arrangement may include a complementary metal-oxide-semiconductor (CMOS) pass gate circuit and a bootstrap circuit. The bootstrap circuit may be electrically connected to the CMOS pass gate circuit. The bootstrap circuit may increase a drive gain of the CMOS pass gate circuit.

In combination with any of the above examples, the CMOS pass gate circuit may include a first n-channel transistor and a first p-channel transistor. The bootstrap circuit may include including a second n-channel transistor and a second p-channel transistor. The second n-channel transistor may be electrically connected to the first n-channel transistor. The second p-channel transistor may be electrically connected to the first p-channel transistor. The second n-channel transistor may convey a first drive voltage to the first n-channel transistor. The second p-channel transistor may convey a second drive voltage to the first p-channel transistor.

In combination with any of the above examples, the first p-channel transistor may include a gate terminal, a source terminal, and a drain terminal. The first n-channel transistor may include a gate terminal, a source terminal, and a drain terminal. The second p-channel transistor may include a gate terminal, a source terminal, and a drain terminal. The second n-channel transistor may include a gate terminal, a source terminal, and a drain terminal.

In combination with any of the above examples, the circuit may include an input terminal to receive an input signal. The input terminal may be electrically connected to the respective source terminals of the first n-channel transistor and the first p-channel transistor. A first capacitive coupling may be formed between the gate and source terminals of the first n-channel transistor by the first drive voltage. A second capacitive coupling may be formed between the gate and source terminals of the first p-channel transistor by the second drive voltage.

In combination with any of the above examples, a first gate-source voltage of the first n-channel transistor may have a first constant voltage value maintained by the first capacitive coupling. A second gate-source voltage of the first p-channel transistor may have a second constant voltage value maintained by the second capacitive coupling.

In combination with any of the above examples, the circuit arrangement may include a control circuit and an input terminal. The gate terminal of the first p-channel transistor may be electrically connected to the source terminal of the second p-channel transistor. The gate terminal of the first n-channel transistor may be electrically connected to the source terminal of the second n-channel transistor. The source terminals of the first p-channel transistor and the first n-channel transistor may be electrically connected to the input terminal. The gate terminals of the second p-channel transistor and the second n-channel transistor may be electrically connected to one or more power supplies. The drain terminals of the second p-channel transistor and the second n-channel transistor may be electrically connected to the control circuit.

According to various examples of the present disclosure, a method is provided. One or more power supplies may activate a bootstrap circuit. A control circuit may generate one or more control signals. A complementary metal-oxide-semiconductor (CMOS) pass gate circuit may be activated by the bootstrap circuit based on the one or more control signals. The CMOS pass gate circuit may receive an input signal. The bootstrap circuit may increase a drive gain of the CMOS pass gate circuit.

In combination with any of the above examples, a first drive voltage corresponding to a first complementary control signal of the one or more control signals may be received by a first n-channel transistor of the CMOS pass gate circuit from the bootstrap circuit. A second drive voltage corresponding to a second complementary control signal of the one or more control signals may be received by a first p-channel transistor of the CMOS pass gate circuit from the bootstrap circuit.

In combination with any of the above examples, a first capacitive coupling may be generated in response to receiving the first drive voltage at the first n-channel transistor. The first capacitive coupling may be generated between a gate terminal and a source terminal of the first n-channel transistor. A second capacitive coupling may be generated in response to receiving the second drive voltage at the first p-channel transistor. The second capacitive coupling may be generated between a gate terminal and a source terminal of the first p-channel transistor.

In combination with any of the above examples, increasing the drive gain of the CMOS pass gate circuit includes increasing a first gate voltage of the first n-channel transistor in response a rise in the input signal. The second capacitive coupling may decrease the second gate voltage in response to a fall in the input signal.

In combination with any of the above examples, the input signal may increase in voltage during a rise period and decrease in voltage during a fall period. Increasing the drive gain of the CMOS pass gate circuit includes maintaining a first constant voltage value of a first gate-source voltage of the first n-channel transistor and a second constant voltage value of a second gate-source voltage of the first p-channel transistor during the rise period and the fall period. The first capacitive coupling may maintain the first constant voltage value. The second capacitive coupling may maintain the second constant voltage value.

While the present disclosure has been described herein with respect to certain illustrated examples, those of ordinary skill in the art will recognize and appreciate that the present disclosure is not so limited. Rather, many additions, deletions, and modifications to the illustrated and described examples may be made without departing from the scope of the disclosure as hereinafter claimed along with their legal equivalents. In addition, features from one example may be combined with features of another example while still being encompassed within the scope of the disclosure as contemplated by the inventors.

What is claimed is:

1. An apparatus comprising:

a complementary metal-oxide-semiconductor (CMOS) pass gate circuit including a first n-channel transistor and a first p-channel transistor;

a control circuit to generate control signals to activate the CMOS pass gate circuit;

a bootstrap circuit electrically connected between the CMOS pass gate circuit and the control circuit, said bootstrap circuit to increase a first drive gain of the first n-channel transistor and a second drive gain of the first p-channel transistor; and an input terminal electrically connected to the CMOS pass gate circuit, said input terminal to convey an input signal to the CMOS pass gate circuit, said input signal to alternate between a high voltage level and a low voltage level, said high voltage level being greater than said low voltage level, wherein said bootstrap circuit comprises a second n-channel transistor and a second p-channel transistor, said second n-channel transistor electrically connected between the control circuit and the first n-channel transistor, said second p-channel transistor electrically connected between the control circuit and the first p-channel transistor, said second n-channel transistor to receive a first complementary control signal of the control signals and convey a first drive voltage corresponding to the first complementary control signal to the first n-channel transistor, said first drive voltage to activate the first n-channel transistor and increase the first drive gain, said second p-channel transistor to receive a second complementary control signal of the control signals and convey a second drive voltage corresponding to the second complementary control signal to the first p-channel transistor, said second drive voltage to activate the first p-channel transistor and increase the second drive gain, respective ones of said first p-channel transistor, first n-channel transistor, second p-channel transistor, and second n-channel transistor including a respective gate terminal, a respective source terminal, and a respective drain terminal, a first capacitive coupling being formed between the gate and source terminals of the first n-channel transistor, said first capacitive coupling generated by the first drive voltage, a second capacitive coupling being formed between the gate and source terminals of the first p-channel transistor, said second capacitive coupling generated by the second drive voltage.

2. The apparatus of claim 1, wherein said control circuit including an output having a first signal path electrically connected to the second p-channel transistor and a second signal path electrically connected to the second n-channel transistor, said second signal path including an inverter, said inverter to invert a control signal of the control signals to generate the first complementary control signal.

3. The apparatus of claim 1, wherein said control circuit includes a first output electrically connected to the second n-channel transistor and a second output electrically connected to the second p-channel transistor, said first output to convey the first complementary control signal to the second n-channel transistor, said second output to convey the second complementary control signal to the second p-channel transistor.

4. The apparatus of claim 1, said first and second capacitive couplings to increase a first gate voltage of the first n-channel transistor and a second gate voltage of the first p-channel transistor in proportion to a rise of the input signal.

5. The apparatus of claim 1, said first and second capacitive couplings to decrease a first gate voltage of the first n-channel transistor and a second gate voltage of the first p-channel transistor in proportion to a fall of the input signal.

6. The apparatus of claim 1, including said gate terminal of the first p-channel transistor electrically connected to the source terminal of the second p-channel transistor, said gate terminal of the first n-channel transistor electrically connected to the source terminal of the second n-channel transistor, said source terminals of the first p-channel transistor and the first n-channel transistor electrically connected to the input terminal, said gate terminals of the second p-channel transistor and the second n-channel transistor electrically connected to one or more power supplies, said drain terminals of the second p-channel transistor and the second n-channel transistor electrically connected to the control circuit.

7. The apparatus of claim 1, comprising a first gate-source voltage of the first n-channel transistor to have a first constant voltage value maintained by said first capacitive coupling, a second gate-source voltage of the first p-channel transistor to have a second constant voltage value maintained by said second capacitive coupling.

8. The apparatus of claim 7, said first constant voltage value being maintained at a source voltage Vdd, said second constant voltage value being maintained at a negative source voltage –Vdd.

9. The apparatus of claim 1, said first and second capacitive couplings being responsive to respective charge trapping at the gate terminals of the first n-channel transistor and the first p-channel transistor, said charge trapping being formed by a shutoff condition of the second n-channel transistor and the second p-channel transistor of the bootstrap circuit.

10. A circuit arrangement comprising:

a complementary metal-oxide-semiconductor (CMOS) pass gate circuit including a first n-channel transistor and a first p-channel transistor;

a bootstrap circuit electrically connected to the CMOS pass gate circuit, said bootstrap circuit to increase a drive gain of the CMOS pass gate circuit; and an input terminal to receive an input signal, said input terminal electrically connected to the respective source terminals of the first n-channel transistor and the first p-channel transistor, wherein said bootstrap circuit comprises a second n-channel transistor electrically connected to the first n-channel transistor and a second p-channel transistor electrically connected to the first p-channel transistor, said second n-channel transistor to convey a first drive voltage to the first n-channel transistor, said second p-channel transistor to convey a second drive voltage to the first p-channel transistor, respective ones of said first p-channel transistor, first n-channel transistor, second p-channel transistor, and second n-channel transistor including a respective gate terminal, a respective source terminal, and a respective drain terminal, a first capacitive coupling being formed between the gate and source terminals of the first n-channel transistor, said first capacitive coupling generated by the first drive voltage, a second capacitive coupling being formed between the gate and source terminals of the first p-channel transistor, said second capacitive coupling generated by the second drive voltage.

11. The circuit arrangement of claim 10, comprising a first gate-source voltage of the first n-channel transistor to have a first constant voltage value maintained by said first capacitive coupling, a second gate-source voltage of the first p-channel transistor to have a second constant voltage value maintained by said second capacitive coupling.

12. The circuit arrangement of claim 11, said first constant voltage value being maintained at a source voltage Vdd, said second constant voltage value being maintained at a negative source voltage –Vdd.

13. The circuit arrangement of claim 10, comprising a control circuit, said gate terminal of the first p-channel transistor electrically connected to the source terminal of the second p-channel transistor, said gate terminal of the first n-channel transistor electrically connected to the source terminal of the second n-channel transistor, said source terminals of the first p-channel transistor and the first n-channel transistor electrically connected to the input terminal, said gate terminals of the second p-channel transistor and the second n-channel transistor electrically connected to one or more power supplies, said drain terminals of the second p-channel transistor and the second n-channel transistor electrically connected to the control circuit.

14. The circuit arrangement of claim 13, said control circuit to generate a control signal to activate the CMOS pass gate circuit, wherein said control circuit includes an output having a first signal path electrically connected to the second p-channel transistor and a second signal path electrically connected to the second n-channel transistor, said second signal path includes an inverter, said inverter to invert the control signal to generate a first complementary control signal.

15. The circuit arrangement of claim 13, said control circuit to generate control signals to activate the CMOS pass gate circuit, wherein said control signals include a first complementary control signal and a second complementary control signal, said control circuit includes a first output electrically connected to the second n-channel transistor and a second output electrically connected to the second p-channel transistor, said first output to convey the first complementary control signal to the second n-channel transistor, said second output to convey the second complementary control signal to the second p-channel transistor.

16. The circuit arrangement of claim 10, said first and second capacitive couplings being responsive to respective charge trapping at the gate terminals of the first n-channel transistor and the first p-channel transistor, said charge trapping being formed by a shutoff condition of the second n-channel transistor and the second p-channel transistor of the bootstrap circuit.

17. A method comprising:

activating, by one or more power supplies, a bootstrap circuit;

generating, by a control circuit, one or more control signals;

activating, by the bootstrap circuit, a complementary metal-oxide-semiconductor (CMOS) pass gate circuit based on the one or more control signals;

receiving, by the CMOS pass gate circuit, an input signal;

increasing, by the bootstrap circuit, a drive gain of the CMOS pass gate circuit;

receiving, by a first n-channel transistor of the CMOS pass gate circuit, a first drive voltage corresponding to a first complementary control signal of the one or more control signals from the bootstrap circuit;

receiving, by a first p-channel transistor of the CMOS pass gate circuit, a second drive voltage corresponding to a second complementary control signal of the one or more control signals from the bootstrap circuit;

generating, in response to receiving the first drive voltage at the first n-channel transistor, a first capacitive coupling between a gate terminal and a source terminal of the first n-channel transistor, and generating, in response to receiving the second drive voltage at the first p-channel transistor, a second capacitive coupling between a gate terminal and a source terminal of the first p-channel transistor.

18. The method of claim 5, wherein increasing the drive gain of the CMOS pass gate circuit comprises increasing, by the first capacitive coupling, a first gate voltage of the first n-channel transistor in response to a rise in the input signal, decreasing, by the second capacitive coupling, a second gate voltage of the first p-channel transistor in response to a fall in the input signal.

19. The method of claim 5, said input signal increasing in voltage during a rise period and decreasing in voltage during a fall period, said increasing of the drive gain of the CMOS pass gate circuit including maintaining, by the first capacitive coupling, a first constant voltage value of a first gate-source voltage of the first n-channel transistor during the rise period and the fall period, maintaining, by the second capacitive coupling, a second constant voltage value of a second gate-source voltage of the first p-channel transistor during the rise period and the fall period.

20. The method of claim 19, said first constant voltage value being maintained at a source voltage Vdd, said second constant voltage value being maintained at a negative source voltage −Vdd.

* * * * *